(12) United States Patent
Borghetti et al.

(10) Patent No.: US 8,907,455 B2
(45) Date of Patent: Dec. 9, 2014

(54) VOLTAGE-CONTROLLED SWITCHES

(75) Inventors: Julien Borghetti, Mountain View, CA (US); Matthew D. Pickett, San Francisco, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 71 days.

(21) Appl. No.: 13/130,817

(22) PCT Filed: Jan. 28, 2009

(86) PCT No.: PCT/US2009/032285
§ 371 (c)(1),
(2), (4) Date: May 24, 2011

(87) PCT Pub. No.: WO2010/087821
PCT Pub. Date: Aug. 5, 2010

(65) Prior Publication Data
US 2011/0227045 A1    Sep. 22, 2011

(51) Int. Cl.
*H01L 21/00* (2006.01)
*H01L 45/00* (2006.01)

(52) U.S. Cl.
CPC .............. *H01L 45/08* (2013.01); *H01L 45/16* (2013.01); *H01L 45/1233* (2013.01); *H01L 45/146* (2013.01)
USPC ....... 257/608; 257/29; 257/E29.005; 438/139

(58) Field of Classification Search
USPC ............ 257/608, 659, 29, E29.005; 438/104, 438/139
See application file for complete search history.

(56) References Cited

U.S. PATENT DOCUMENTS

| | | | |
|---|---|---|---|
| 3,877,049 A | 4/1975 | Buckley | |
| 2002/0168820 A1* | 11/2002 | Kozicki et al. | ......... 438/259 |
| 2005/0111290 A1* | 5/2005 | Kozicki et al. | ......... 365/232 |
| 2008/0036508 A1 | 2/2008 | Sakamoto et al. | |
| 2008/0232154 A1 | 9/2008 | Kinoshita | |
| 2008/0239707 A1 | 10/2008 | Tsukamoto et al. | |
| 2008/0265235 A1 | 10/2008 | Kamigaichi et al. | |

FOREIGN PATENT DOCUMENTS

JP    2006-253711    9/2006

OTHER PUBLICATIONS

Donald A. Neaman. Semiconductor Physics and Devices. IRWIN, Inc., 1992, pp. 439-444. (PCT Search Report).
PCT Search Report, Hewlett-Packard Development Company, L.P., PCT/US2009/032285, Sep. 30, 2009.
Y. Liu, et al., "Charging effect of Al2O3 thin films containing Al nanocrystals", Applied Physics Letters 93, 142106 (2008).

* cited by examiner

*Primary Examiner* — Amar Movva
(74) *Attorney, Agent, or Firm* — Thorpe North & Western, LLP; Richard L. Green

(57) ABSTRACT

A voltage-controlled switch comprises a first electrode, a second electrode, a switching junction situated between the first electrode and the second electrode, a conducting channel extending from adjacent to the origin through the switching junction and having a channel end situated near the second electrode, and a layer of dopants situated adjacent to an interface between the switching junction and the second electrode, wherein the dopants are capable of being activated to form switching centers.

20 Claims, 1 Drawing Sheet

VOLTAGE-CONTROLLED SWITCHES

BACKGROUND

Nanometer-scale crossed-wire switching devices have been reported that can be switched reversibly and exhibit an ON-to-OFF conductance ratio of about $10^3$. Such devices have been used to construct crossbar circuits and provide a promising route for the creation of ultra-high density non-volatile memory and non-volatile device based electronics. A series connection of crossed-wire switches has been used to construct a latch, which is an important component of logic circuits and for communication between logic and memory. New logic families constructed from crossbar arrays of switches have the potential to dramatically increase the computing efficiency of CMOS circuits. The ability to impart additional characteristics to such devices in fabrication can further broaden the range of possible applications.

DETAILED DESCRIPTION OF EXAMPLE EMBODIMENTS

Reference will now be made to the exemplary embodiments illustrated, and specific language will be used herein to describe the same. Features and advantages of the invention will be apparent from the detailed description which follows, taken in conjunction with the accompanying drawings, which together illustrate, by way of example, features of the invention.

The present disclosure is generally directed to voltage-controlled devices, particularly switching devices in which conductance can be reversibly affected by a suprathreshold bias voltage and the conductance is stable in the absence of such a voltage. Embodiments of the present invention provide voltage-controlled devices that minimize potential nonlinearities that may characterize resistive switching junctions. Fabrication approaches disclosed herein can provide devices with conduction modes that are substantially ohmic. In a general embodiment, a voltage-controlled device may comprise a first electrode, a second electrode, and a switching junction situated between them. The switching junction can further comprise a layer containing dopants located at or adjacent to a surface of the region that is an interface with one of the electrodes. The device may also comprise one or more conducting formations that serve to direct current through the switching junction.

Figure 1:
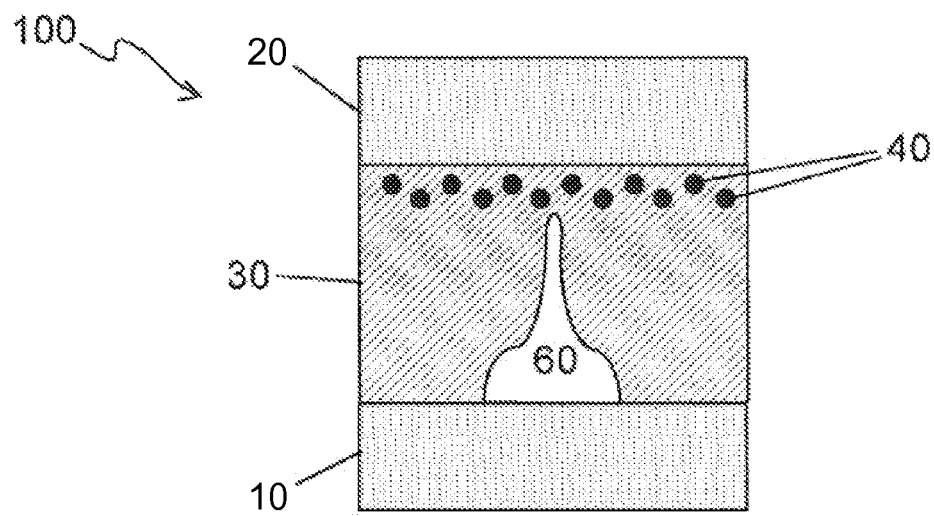
FIG. 1 is a cross-sectional illustration of a switch in accordance with an embodiment of the present invention.

FIG. 1 provides an illustration of a device 100 in accordance with an embodiment. The device includes a first electrode 10 and a second electrode 20. The electrodes may comprise one or more metals or other suitable materials. Non-limiting examples of suitable metals include gold, platinum, tungsten, and copper.

Situated between the electrodes is a switching junction 30 that serves as the general region of the device in which variable resistance characteristics are exhibited. The switch junction can comprise any material suitable as a dielectric in semiconductor devices. The switching junction material may be in a crystalline or an amorphous state. Non-limiting examples include oxides, sulfides, selenides, nitrides, phosphides, arsenides, chlorides, and bromides of silicon, transition metals, rare earth metals, or alkaline earth metals. In a particular embodiment, the switch junction material comprises a metal oxide. Non-limiting examples of such materials are titanium dioxide, hafnia, zirconia, strontia, and alumina. In a more particular embodiment, the switch junction material comprises titanium dioxide.

Figure 2:
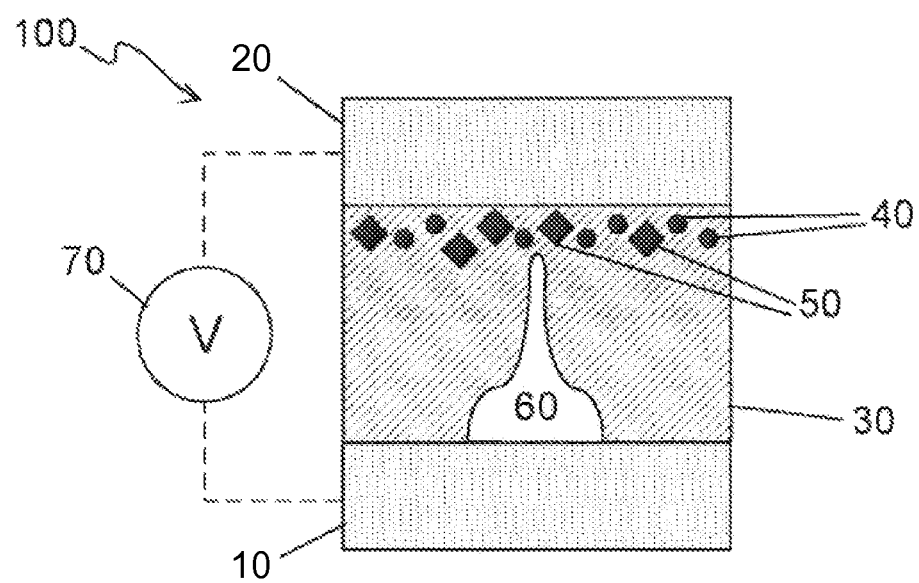
FIG. 2 illustrates the application of an activating voltage to a switch as in FIG. 1.

The switch junction may be doped with dopants 40 that can be activated using an activating voltage to create switching centers 50 as shown in FIG. 2. Each switching center can provide conductivity to the otherwise largely insulative junction. The dopants may be any molecular species or defect that is capable of trapping or releasing electronic charge carriers (i.e. electrons or holes) under the appropriate conditions. More specifically, the species of dopants used in the device may be chosen for their ability to participate in reduction/oxidation reactions as a process of activating the centers. The switching centers may be appropriate molecular species implanted in the junction, or may be defects created in the junction material by conventional means.

The switching centers may be situated in the junction so as to be accessible for electronic conduction. In a particular embodiment, the switching centers may be situated substantially adjacent to the surface of the junction that interfaces with one of the electrodes. In one aspect, the switching centers may be present in a layer applied to or created in the switching junction. In another aspect, the switching centers may be individually implanted at or slightly below the surface of the switching junction.

The device can further comprise a conducting channel 60 formed so as to guide current through the device according to a particular geometry. In a particular embodiment, the device includes a conducting channel that originates from near the first electrode, extends through the junction, and has an end that is near the second electrode. The conducting channel as a whole or parts thereof may be substantially hollow. In a more particular aspect, the conducting channel is substantially hollow from its origin to its end. In such embodiment, current may travel substantially along the contours of the channel, rather than through the hollow space inside it. In an alternate embodiment, the conducting channel may include conductive material. In a more particular aspect of this embodiment, the conductive material may include metal from the electrode.

In a more specific embodiment, the switching centers are near the interface between the junction and that electrode, so that the end of the conducting channel is also near one or more of the switching centers. To focus and concentrate current flow, the conducting channel can exhibit a marked taper from its origin to its end. A very narrow end may also aid in providing desired modes of conduction, particularly more ohmic conduction. In particular, it has been found that Landauer-type conduction can be possible in such a device that includes a very narrow channel end, particularly an end having nanoscale dimensions. Accordingly in a particular embodiment, the end may be less than about 5 nm in diameter. In a more particular embodiment, the end may be less than or equal to about 1 nm in diameter.

Devices in accordance with the present invention can provide performance characteristics that are highly linear and therefore straightforward to determine. In a particular aspect of these embodiments, the devices provide conduction modes that are substantially ohmic. In a more particular embodiment, the operation of the devices in accordance with these embodiments is based on the Landauer formula and provides Landauer-type conduction.

Implanted switching centers in or near the surface of the switching junction can each provide a unitary change in the resistance of the device. Applying a sufficiently large activating voltage across the device via a voltage source 70 can oxidize or reduce implanted sites—depending on the species and the voltage polarity—thereby activating them for participation in transmitting electronic current through the device. In a particular aspect, the function of the conducting channel may result in activation primarily of switching centers adjacent to the conducting channel. Under small bias voltages, e.g. voltages in the normal operating range of the device, the conductivity of the device is based on the average state (active or inactive) of the switching centers. Since this characteristic may be linear at the first order, the device can ideally approach linear conduction behavior. As such, the current-voltage function of such a device may be linear and have a slope that is proportional to the number of active switching centers.

Furthermore, this characteristic can be largely determined during device fabrication by manipulating the surface chemistry of the switching junction. For example, species of molecular switching centers with known redox potentials may be chosen for implantation in the junction material. In addition, where multiple species are used, the relative and/or absolute concentrations of each may be particularly chosen. By determining these and other parameters beforehand, it can be possible to determine how the device will respond to an activating voltage. For example, the proper threshold voltage for activating the device and modulating conductance to a desired degree can be determined based on the redox potentials of the switching sites. Therefore, the essential linearity of these characteristics can impart a heightened degree of predictability to the devices.

To further illustrate this, an example of operation of such devices may include applying a suprathreshold voltage to an unactivated device, i.e. a device in a non-conducting or "off" state. A sufficient voltage strength, duration, and polarity may be chosen based on the species of dopants in the junction and a knowledge of what polarity and strength is likely to cause reduction or oxidation of a desired portion of the dopants so as to produce a certain level of conductivity. This conductivity state may subsequently be increased by further application of the same voltage or a higher voltage. Alternatively, the state may be reversed by applying a sufficient voltage at an opposite polarity.

The present disclosure also sets forth methods by which a device according to the above embodiments may be made. According to an embodiment of the method, the first electrode may be deposited as an initial step. The electrode may be deposited on a conventional substrate by techniques known to be appropriate to the material used. Non-limiting examples of substrate materials include silicon dioxide, silicon nitride, magnesium oxide, strontium titanate, and glass. For example, metal electrodes may be made by photolithography or electron beam lithography, or by more advanced techniques, such as imprint lithography. The thickness of this electrode and the second electrode may be chosen according to specifications desired for the device. In one embodiment, the thickness of the electrode ranges from about 5 nm to about 30 nm.

A switching junction may then be deposited onto the first electrode from junction material, as described above. The junction material may be deposited by conventional techniques, including evaporation from a Knudsen cell, electron beam from a crucible, sputtering from a target, electron beam evaporation, chemical vapor deposition (CVD), metal-organic chemical vapor deposition (MOCVD), molecular beam epitaxy, atomic layer deposition, or other forms of chemical vapor or beam growth from reactive precursors. The thickness and area of the switching junction may be chosen based on desired device characteristics. Particular considerations in selecting the dimensions may arise regarding the formation of the conducting channel later in the process as described below. That is, the active region can have a thickness that allows the channel to extend to within a particular distance from the implanted switching centers or from the second electrode.

After the switching junction has been deposited, the second electrode may be deposited onto the switching junction. In one embodiment, the second electrode may be deposited on a surface of the switching junction that is substantially opposite the surface adjacent to the first electrode.

A next step in making the device can comprise forming a conducting channel through the switching junction. In a particular embodiment, the channel is created by an electroforming technique. More specifically, such a technique can comprise initially applying a brief voltage bias stress between the two electrodes, which creates a localized conducting channel 60 extending from the first electrode toward the second electrode through the otherwise resistive junction material. While not wishing to be bound to a particular theory, it is believed that formation of the channel may occur through any of a number of mechanisms including electrode melting or other electrode deformation, solid electrolysis, electromigration, field-induced dislocation, electroreduction of junction material, or any combination of these. One result of the creation of the channel can be that only a thin layer of junction material remains between the channel end and the implanted dopants. The dopants can define the electrical conduction between the second electrode and a more resistive part of the device (i.e. the remaining layer of junction material adjacent to the channel end).

A non-limiting example of this technique to make the disclosed devices can be as follows. In a device with a metal oxide switching junction, an electroforming voltage (top electrode negative) may be established between the electrodes, causing oxygen ions to move toward the bottom electrode so that $O_2$ gas is produced below the junction and accumulates to form bubbles. These cause delamination and deformation of the junction material as they press upward. The deformation produces a channel that extends substantially through the junction. The strength and duration of the voltage used may be selected so that the deformation produced does not completely penetrate the junction. A voltage having the opposite polarity may then be applied between the electrodes to cause the gas to reincorporate into the metal oxide.

In some embodiments, the same strength and polarity voltage that results in electroforming the channel may also cause the oxidation or reduction of implanted switching species in the device. As such, the step of electroforming the conducting channel may also serve to activate the device.

As indicated above, the dimensions of the switching junction layer and the second electrode can have a role in the method. For example, the junction layer may be deposited at a thickness so that an electroformed channel will likely end within a certain distance from the second electrode. In one aspect of the embodiment, the end is situated within about 5 nm from the second electrode. In a more specific aspect, the end is situated within about 1 nm from the second electrode. Another dimension which may have an impact on the disclosed embodiments is the area of the switching junction and the top electrode. The switching junction and top electrode may both be much smaller than the first electrode, which may be a sheet electrode upon which a number of devices are built. As such, these upper layers may be very small, e.g. in the nanoscale. Accordingly, in one embodiment the area of the switching junction is from 0.025 square nanometers to about 0.9 square nanometers.

These and other considerations related to scale are particularly addressable in devices according to the above embodiments. In addition to providing substantially ohmic modes of conduction, the approach disclosed herein for making voltage-controlled switches can also impart a useful degree of scalability. The disclosed methods provide devices with conduction behavior that scales to the ultimate scale of individual molecular switching sites. As discussed above, the switching junction chemistry can be tailored by selecting suitable switching center species, allowing for a wide range of properties to be incorporated into such devices. At the same time, the linear operating principle of the devices can provide a reliability and scalability, as the characteristics of each device is based in the well-defined electrochemical redox potential of the switching center species.

Summarizing and reiterating to some extent, a method for making a voltage-controlled switch has been disclosed which provides substantial linearity, scalability, and reliability. The device can include substantially ohmic conduction modes based on defined electrochemistry. While the forgoing exemplary embodiments are illustrative of the principles of the present invention in one or more particular applications, it will be apparent to those of ordinary skill in the art that numerous modifications in form, usage and details of implementation can be made without the exercise of inventive faculty, and without departing from the principles and concepts of the invention. Accordingly, it is not intended that the invention be limited, except as by the claims set forth below.

What is claimed is:

1. A voltage-controlled switch, comprising:
   a first electrode;
   a second electrode;
   a switching junction situated between the first electrode and the second electrode;
   a conducting channel having an origin adjacent to the first electrode and extending through the switching junction, and having a channel end situated near the second electrode; and
   dopants in the switching junction situated adjacent to an interface between the switching junction and the second electrode, the dopants being switching centers that are capable of being activated to conduct electricity, the dopants and the switching junction comprising different chemical elements;
   wherein the switch is in a first state when a first number of the switching centers are active and conductive, and the switch is in a second state when a second number of the switching centers are active and conductive, the second number of the switching centers being greater than the first number of the switching centers so the second state is more conductive than the first state.

2. The voltage-controlled switch of claim 1, wherein the channel end has a diameter of less than or equal to about 5 nm.

3. The voltage-controlled switch of claim 1, wherein the channel end is situated within about 5 nm from the second electrode.

4. The voltage-controlled switch of claim 1, wherein the switching centers are primarily adjacent to the conducting channel.

5. The voltage-controlled switch of claim 1, wherein the switch is configured for substantially ohmic conduction upon activation.

6. The voltage-controlled switch of claim 5, wherein the switch is configured for Landauer-type conduction upon activation.

7. The voltage-controlled switch of claim 1, wherein the switching junction comprises a metal oxide.

8. The voltage-controlled switch of claim 1, wherein the conducting channel is substantially hollow from the original to the channel end.

9. The voltage-controlled switch of claim 1, wherein the dopants are only situated adjacent to the interface.

10. The voltage-controlled switch of claim 1, wherein the dopants comprise less than one atomic percent of the switching junction.

11. A method of fabricating a voltage-controlled switch, comprising:
    preparing a first electrode;
    depositing a switching junction onto the first electrode;
    placing dopants into the switching junction, the dopants being switching centers that are configured to be activated to conduct electricity, the dopants and the switching junction comprising different chemical elements;
    depositing a second electrode onto the switching junction; and
    forming a conducting channel through the switching junction;
    wherein the switch is in a first state when a first number of the switching centers are active and conductive, and the switch is in a second state when a second number of the switching centers are active and conductive, the second number of the switching centers being greater than the first number of the switching centers so the second state is more conductive than the first state.

12. The method of claim 11, wherein the forming step is accomplished by establishing an electroforming voltage between the first electrode and the second electrode sufficient to electroform the conducting channel.

13. The method of claim 12, wherein the electroforming voltage also activates the switching centers.

14. The method of claim 11, further comprising activating the switching centers by applying a bias voltage across the electrodes.

15. The method of claim 11, wherein the switching junction comprises a metal oxide.

16. The method of claim 11, wherein the channel end has a diameter of less than about 5 nm.

17. The method of claim 11, wherein the channel end is situated within about 5 nm from the second electrode.

18. The method of claim 11, wherein the conducting channel is substantially hollow from the original to the channel end.

19. The method of claim 11, wherein the dopants are only placed adjacent to the interface.

20. The method of claim 11, wherein the dopants comprise less than one atomic percent of the switching junction.

* * * * *